United States Patent [19]

Ogasawara et al.

[11] 4,319,238

[45] Mar. 9, 1982

[54] CAMERA DISPLAY DEVICE

[75] Inventors: Akira Ogasawara; Ken Utagawa, both of Yokohama; Kunihisa Hoshino; Hiroshi Shirasu, both of Kawasaki, all of Japan

[73] Assignee: Nippon Kogaku K.K., Tokyo, Japan

[21] Appl. No.: 116,393

[22] Filed: Jan. 29, 1980

[30] Foreign Application Priority Data

Feb. 6, 1980 [JP] Japan ................................. 54/11837

[51] Int. Cl.³ ............................................. G09G 3/00
[52] U.S. Cl. ................................... 340/753; 340/715; 364/561
[58] Field of Search ....................... 340/753, 754, 715; 364/561, 562

[56] References Cited

U.S. PATENT DOCUMENTS

| 4,111,552 | 9/1978 | Bodlaj | 364/561 |
| 4,113,381 | 9/1978 | Epstein | 364/561 |
| 4,158,229 | 6/1979 | Woo, Jr. et al. | 364/562 |
| 4,183,025 | 1/1980 | Kutaragi | 340/753 |
| 4,200,896 | 4/1980 | Baumann | 340/715 |
| 4,210,908 | 7/1980 | Sakakibara | 340/715 |

*Primary Examiner*—Marshall M. Curtis
*Attorney, Agent, or Firm*—Fitzpatrick, Cella, Harper & Scinto

[57] ABSTRACT

A display device for a camera uses at least two display elements to display visual information such as focus information. Signals are produced, the relative phases of which indicate in-focus or out of focus conditions.

2 Claims, 3 Drawing Figures

FIG. 1
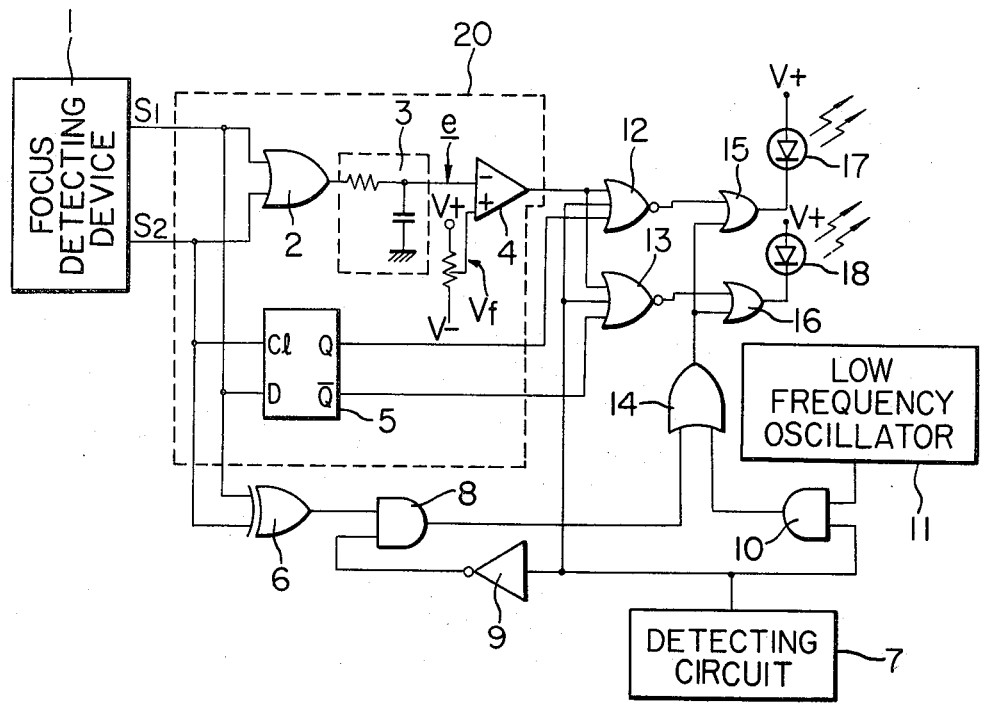
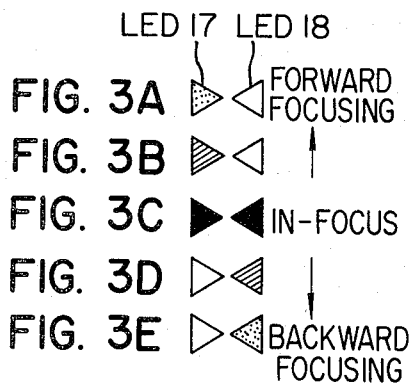
FIG. 3A  LED 17  LED 18  FORWARD FOCUSING
FIG. 3B
FIG. 3C  IN-FOCUS
FIG. 3D
FIG. 3E  BACKWARD FOCUSING

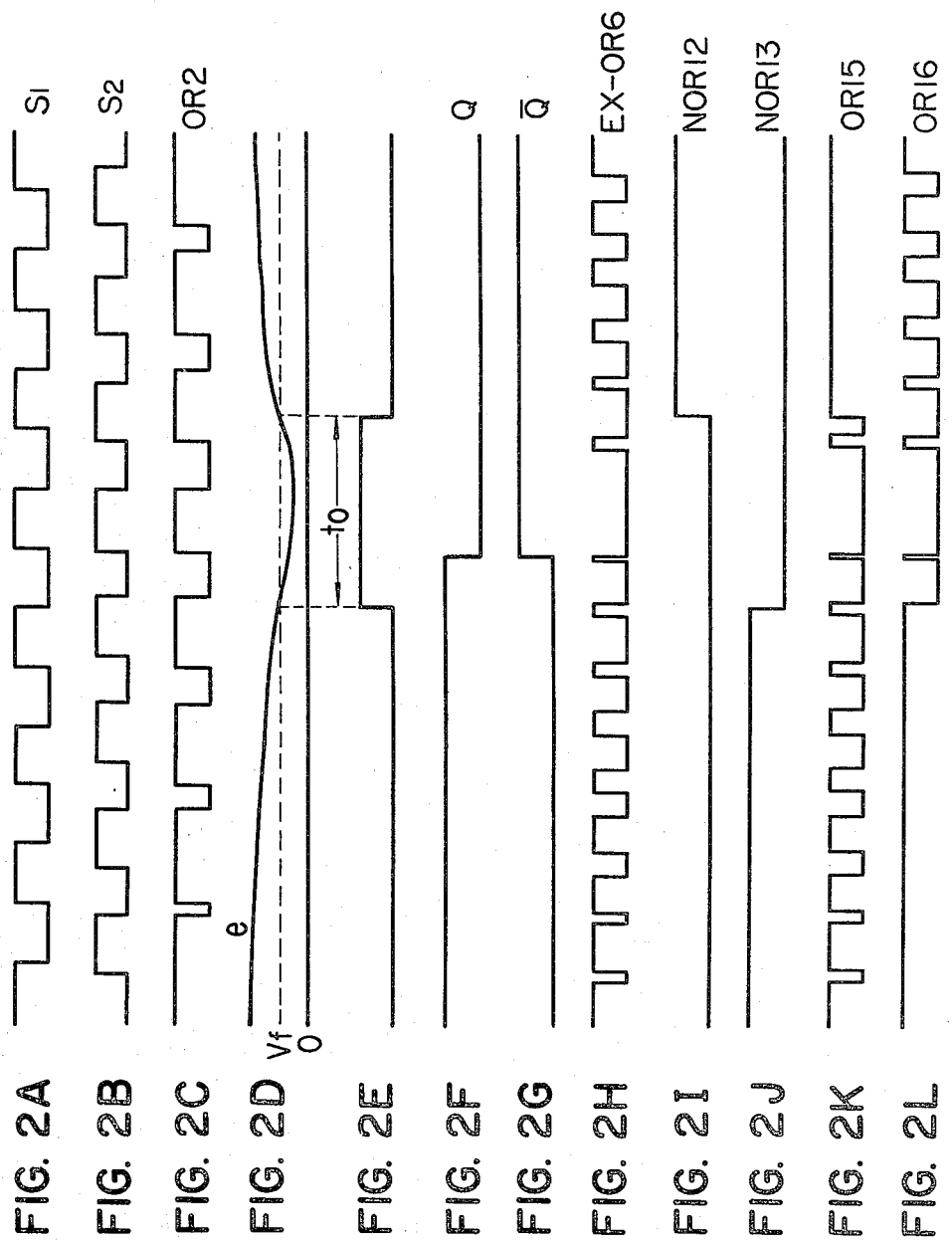

CAMERA DISPLAY DEVICE

BACKGROUND OF THE INVENTION

1. Field of the Invention

This invention relates to a display device for displaying exposure information and focus position information on the basis of the output of a measuring device, particularly, an exposure control device, a focus detecting device or the like of a camera.

2. Description of the Prior Art

As a display device for displaying a conformable condition, a first condition deviated toward one side from said conformable condition and a second condition deviated toward the other side from said conformable condition on the basis of an output representing said conditions and the amounts of deviation from said conformable condition, such as the output of the focus detecting device or the exposure meter of a camera, there has been a device as disclosed in Japanese Laid-Open patent application No. 49027/1977 (corresponding German Application No. P 25 37 482.7). This device receives as input a signal representing the focus position which is put out by the focus detecting device, and thereby displays the distinction between the forward focusing (a first condition), the in-focus (a conformable condition) and the backward focusing (a second condition), and the amount of deviation from the in-focus (the amount of deviation from the conformable condition), by the difference in brightness between two LEDs. Accordingly, the observer of such display device had to carefully observe the difference in brightness between the two LEDs. That is, the two LEDs have both been turned on with substantially equal brightnesses in the case of the in-focus, and their relative brightness has only been varied during the other times than the in-focus. Accordingly with such device, it has been difficult for the observer to quantitatively discriminate the difference in brightness.

SUMMARY OF THE INVENTION

It is the object of the present invention to provide a display device which uses at least two electric display elements and displays a conformable condition, a first condition and a second condition by which of the display elements is turned-on, and in which the brightness of the turned-on display element is varied in accordance with the amount of deviation from the conformable condition.

The invention will become fully apparent from the following detailed description thereof taken in conjunction with the accompanying drawings.

BRIEF DESCRIPTION OF THE DRAWINGS

FIG. 1 is a circuit diagram showing an embodiment of the present invention.

FIG. 2 including 2A–2L is a timing chart showing the manner of operation of each signal in the circuit of FIG. 1.

FIG. 3, including 3A–3E simply shows the turned-on states of display elements in the operation of the embodiment.

DESCRIPTION OF THE PREFERRED EMBODIMENTS

The invention will hereinafter be described with respect to an embodiment thereof. The embodiment shows a display device used in a focus detecting device. The electric display elements used in the present invention are solid elements such as LEDs, liquid crystal or electrochromic elements and not mechanical ones such as meters.

In FIG. 1, a focus detecting device 1 puts out two rectangular wave signals $S_1$ and $S_2$ of the same period. These rectangular wave signals $S_1$ and $S_2$ represent, for example, the forward focusing when the signal $S_1$ is advanced in phase with respect to the signal $S_2$, the backward focusing when the signal $S_1$ is delayed in phase with respect to the signal $S_2$, and the in-focus when the two signals $S_1$ and $S_2$ are substantially in the same phase. The absolute value of the phase difference between the signals $S_1$ and $S_2$ represents the amount of deviation from the in-focus position. That is, as the absolute value is greater, it represents a greater amount of deviation from the in-focus position. Such a focus detecting device is known as disclosed in Japanese Laid-Open Patent Application No. 49027/1977 and therefore need not be described in detail herein.

The signals $S_1$ and $S_2$ are converted into a DC voltage e corresponding to the phase difference therebetween by an OR gate 2 receiving the signals $S_1$ and $S_2$ as input and a smoothing circuit 3 for smoothing the output of the OR gate 2. A comparator 4 receives as input the DC voltage e and a reference voltage $V_f$ and generates "H" level output representing the in-focus when the former is smaller than the latter. A D-flip-flop 5 (hereinafter referred to as the D-FF) receiving as input the signals $S_1$ and $S_2$ detects which of the signals $S_1$ and $S_2$ is more advanced in phase. This D-FF5 latches the signal condition of D input by the rising of Cl input signal. Accordingly, it generates "H" level output at its output Q when the phase of the signal $S_2$ is more advanced than that of the signal $S_1$, and generates "H" level output at its output $\overline{Q}$ when the phase of the signal $S_2$ is more delayed than that of the signal $S_1$. In this example, the "H" level of the output $\overline{Q}$ represents the forward focusing and the "H" level of the output Q represents the backward focusing. As described above, the OR gate 2, the smoothing circuit 3, the comparator 4 and the D-FF5 together constitute a discrimination circuit 20 for generating signals regarding the forward focusing, the backward focusing and the in-focus.

On the other hand, an exclusive OR (hereinafter referred to as EX-OR) gate 6 generates a pulse output having a pulse width corresponding to the phase difference between the signals $S_1$ and $S_2$. Accordingly, the output of the EX-OR gate 6 assumes substantially "L" level in the case of the in-focus, and becomes a pulse output having a pulse width corresponding to the absolute amount of deviation from the in-focus in the case of the forward focusing or the backward focusing.

Also, for example, where the focus detecting device 1 is of the type which detects the focus from the contrast of the image of an object to be focused, when the object is uniform in brightness distribution like a black board, the focus detection becomes impossible and therefore, a focus detection impossibility detecting circuit 7 is provided for detecting the uniformity of the brightness distribution. This detecting circuit 7 puts out "H" level signal when the focus detection is impossible as described above.

Further, when the focus detection is impossible, an AND gate 8 is closed by an inverter 9 to interrupt the output signal of the EX-OR gate 6. When the focus detection is impossible, an AND gate 10 is opened, so that the oscillation output signal of a low frequency oscillator (hereinafter referred to as LFO) 11 appears at the output of the AND gate 10.

Description will now be made of a case where the focus detection is possible. At such time, the detecting circuit 7 is putting out "L" level signal. In description, use is made of FIG. 2 which shows the time chart of each signal.

It is assumed that the signals $S_1$ and $S_2$ of the focus detecting device 1 have been put out with respect to time as shown in FIGS. 2A and 2B. It is also assumed that these signals represent the in-focus at time $t_0$ because the phase of the signals $S_1$ and $S_2$ are substantially equal, the forward focusing before time $t_0$ because the phase of the signal $S_1$ is more advanced, and the backward focusing after time $t_0$ because the phase of the signal $S_2$ is more advanced. The OR gate 2 receiving the signals $S_1$ and $S_2$ as input puts out such a signal as shown in FIG. 2C, so that the DC voltage e as shown in FIG. 2D is generated at the output of the smoothing circuit 3. When the in-focus is substantially obtained at time $t_0$, the DC voltage e becomes lower than the reference voltage $V_f$ and therefore, the output of the comparator 4 assumes "H" level as shown in FIG. 2E.

On the other hand, D-FF5 latches the signal $S_1$ by the rising of the signals $S_2$, so that the Q output of D-FF5 puts out such a signal as shown in FIG. 2F and the $\overline{Q}$ output of D-FF5 puts out such a signal as shown in FIG. 2G. Also, the EX-OR gate 6 puts out such a signal as shown in FIG. 2H whose duty cycle is varied in accordance with the phase difference between the signals $S_1$ and $S_2$.

When the in-focus is substantially obtained at time $t_0$, the comparator 4 generates "H" level output, so that NOR gates 12 and 13 generate "L" level outputs as shown in FIG. 2I and 2J. At this time, the AND gate 8 is opened while the AND gate 10 is closed to generate "L" level output and after all, an OR gate 14 puts out such a signal as shown in FIG. 2H which is the same as the output signal of the EX-OR gate 6. Accordingly, in the case of the in-focus, the OR gate 14 puts out "L" level signal as shown in FIG. 2H and OR gates 15 and 16 put out "L" level signals as shown in FIGS. 2K and 2L. Consequently, LEDs 17 and 18 are both turned on with a highly bright light. Thus, the pattern in which the two LEDs 17 and 18 are both operated represents the in-focus.

In the case of the forward focusing, namely, before time $t_0$ in FIG. 2, the comparator 4 puts out "L" level signal and the Q output and $\overline{Q}$ output of D-FF5 assume "H" level and "L" level, respectively, due to the phase difference between the signals $S_1$ and $S_2$. Accordingly, the NOR gate 12 puts out "L" level signal and the NOR gate 13 puts out "H" level signal. Therefore, as shown in FIG. 2L, the OR gate 16 is closed to put out "H" level signal. Thus, the LED 18 is not turned on and only the LED 17 driven by the output signal of the OR gate 15 as shown in FIG. 2K in turned on.

The EX-OR gate 6 puts out a pulse signal having a pulse width corresponding to the amount of deviation from the in-focus, namely, having a variable duty, and the frequency of this pulse signal is 4–10 KHz and the LED 17 is turned on and off at this frequency, but the period of turn-on-and-off thereof is so short that the LED 17 appears to be turned on with a certain brightness to the observer. This brightness becomes higher as the duty thereof is smaller. That is, as the time during which "L" level is assumed in the portion of the pulse signal shown in FIG. 2K is longer, the LED 17 is turned on more brightly. Thus, the operation pattern in which the LED 17 is turned on while the LED 18 is turned off represents the forward focusing.

In the case of the backward focusing, namely, after time $t_0$, the Q output and $\overline{Q}$ output of D-FF5 are "L" level and "H" level, respectively, so that the NOR gate 12 puts out "H" level signal as shown in FIG. 2I and the NOR gate 13 puts out "L" level signal as shown in FIG. 2J. Accordingly, as shown in FIG. 2K, the OR gate 15 is closed and continues to put out "H" level signal, and as shown in FIG. 2L, the OR gate 16 puts out the same pulse signal as the output signal of the EX-OR gate 6, so that only the LED 18 is turned on with a brightness corresponding to the amount of deviation from the in-focus. Thus, the operation pattern in which the LED 17 is turned off while the LED 18 is turned on represents the backward focusing.

When the focus detection is impossible, the detecting circuit 7 puts out "H" level signal, so that the AND gate 8 is closed and the gate 10 is opened and the pulse signal output of several $H_z$ of LFO 11 is applied to the OR gates 15 and 16 through the AND gate 10 and the OR gate 14. Accordingly, when the focus detection is impossible, the LEDs 17 and 18 are both turned on and off with several $H_z$ at the same time.

FIG. 3 simply shows the operation patterns of the LEDs 17 and 18 hitherto described, and the brightness of the LED 17 is $3A < 3B < 3C$, and the brightness of the LED 18 is $3C > 3D > 3E$. In 3C, both LEDs 17 and 18 are turned on to display the in-focus.

While the invention has been described with respect to a specific embodiment thereof, various changes may be made in the above-described embodiment without departing from the scope of the present invention. For example, two electric display elements are used in the shown embodiment, but three such elements may be used. Where three display elements are used, they may be rendered operative for a first, a second and a conformable condition, respectively.

What we claim is:

1. In a camera including a focus detecting device and a display device, wherein the focus detecting device produces a first a.c. signal and a second a.c. signal, the phases of the first and second a.c. signals are almost the same at in-focus condition and the phase of the first a.c. signal is more advanced than the phase of the second a.c. signal at a first condition deviated toward one side from the in-focus condition, while the phase of first a.c. signal is more delayed than the phase of the second a.c. signal at a second condition deviated toward the other side from the in-focus condition; the display device is provided with a first display element and a second display element two of which are used to display said three conditions, said display device comprising:

(a) a first detecting circuit receiving as an input said two a.c. signals and producing a conformity signal when detecting that the phase difference between said two received a.c. signals is within a predetermined value;

(b) a second detecting circuit producing a first signal on the basis of the two a.c. signals as inputs when detecting that a relation of the phases of said two a.c. signals corresponds to said first condition and producing a second signal when detecting that a relation of the phases of said two a.c. signals corresponds to said second condition;

(c) a first circuit for operating said first display element depending on at least one input of said conformity signal and said first signal; and (d) a second circuit for operating said second display element depending upon at least one input of said conformity signal and said second signal, whereby said first and second circuits render both of said first and second display elements operative when said conformity signal is produced, render said first display element operative and said second display element inoperative when only said first signal is produced, and render said second display element operative and said first display element inoperative when only said second signal is produced.

2. In a camera including a measurement device wherein the measurement device produces two a.c. signals, the phases of the two a.c. signals are almost the same in conformable condition, the phase of one a.c. signal is more advanced than the phase of the other a.c. signal at a first condition deviated toward one side from said conformable condition and the phase of the other a.c. signal is more delayed than the phase of the other a.c. signal at a second condition toward the other side from said conformable condition, the camera comprising:

(a) first and a second display elements for displaying said three conditions;

(b) a display circuit for showing such a first pattern that said first display element is oerative and said second display element is inoperative when a relation of the phases of said two a.c. signals corresponds to said first condition on the basis of said two a.c. signals as an input, for showing such a second pattern that said first display element is inoperative and said second display element is operative when a relation of the phases of said two a.c. signals corresponds to said second condition and for showing such a third pattern that the conditions of said first and second display elements are different as compared with said first and second pattern when the phase difference between said two a.c. signals is within a predetermined value;

(c) an impossibility detecting circuit for producing an inhibition signal when said measurement device becomes incapable of mearuring; and (d) a control circuit for controlling said display circuit so as to make the conditions of said first and second display elements a fourth pattern different from any of said first, second and third patterns in response to said inhibition signal.

* * * * *

UNITED STATES PATENT AND TRADEMARK OFFICE
CERTIFICATE OF CORRECTION

PATENT NO. : 4,319,238

DATED : March 9, 1982

INVENTOR(S) : AKIRA OGASAWARA, ET AL.

It is certified that error appears in the above—identified patent and that said Letters Patent is hereby corrected as shown below:

In the headnote, item [30], "1980" should be --1979--.

Column 3, line 58, "in" (second occurrence) should be --is--.

Column 6, line 4, "oerative" should be --operative--

Signed and Sealed this

Twenty-second Day of June 1982

[SEAL]

*Attest:*

*Attesting Officer*

GERALD J. MOSSINGHOFF

*Commissioner of Patents and Trademarks*